(12) United States Patent
Lee et al.

(10) Patent No.: US 7,800,224 B2
(45) Date of Patent: Sep. 21, 2010

(54) POWER DEVICE PACKAGE

(75) Inventors: Joo-sang Lee, Bucheon-si (KR); O-seob Jeon, Seoul (KR); Yong-suk Kwon, Bucheon-si (KR); Frank Chen, Suzhou (CN); Adams Zhu, Suzhou (CN)

(73) Assignee: Fairchild Korea Semiconductor, Ltd., Bucheon-si (KR)

( * ) Notice: Subject to any disclaimer, the term of this patent is extended or adjusted under 35 U.S.C. 154(b) by 55 days.

(21) Appl. No.: 11/965,983

(22) Filed: Dec. 28, 2007

(65) Prior Publication Data

US 2008/0157310 A1  Jul. 3, 2008

(30) Foreign Application Priority Data

Dec. 29, 2006  (KR) .................... 10-2006-0137730

(51) Int. Cl.
H01L 23/495  (2006.01)

(52) U.S. Cl. .................. 257/724; 257/723; 257/678; 257/E23.169; 257/E23.17; 257/E23.175

(58) Field of Classification Search ............... 257/724, 257/736, 750, 781, 678, 723, E23.17, E23.175, 257/E23.169
See application file for complete search history.

(56) References Cited

U.S. PATENT DOCUMENTS

| | | | | |
|---|---|---|---|---|
| 4,172,261 A | * | 10/1979 | Tsuzuki et al. | 257/717 |
| 4,639,760 A | * | 1/1987 | Granberg et al. | 257/705 |
| 5,089,878 A | * | 2/1992 | Lee | 257/664 |
| 5,245,216 A | * | 9/1993 | Sako | 257/676 |
| 5,291,065 A | * | 3/1994 | Arai et al. | 257/723 |
| 5,311,057 A | * | 5/1994 | McShane | 257/676 |
| 5,384,683 A | * | 1/1995 | Tsunoda | 361/313 |
| 5,466,969 A | * | 11/1995 | Tsunoda | 257/706 |
| 5,488,256 A | * | 1/1996 | Tsunoda | 257/723 |
| 5,504,372 A | * | 4/1996 | Braden et al. | 257/723 |
| 5,559,374 A | * | 9/1996 | Ohta et al. | 257/723 |
| 5,747,875 A | * | 5/1998 | Oshima | 257/687 |
| 5,757,070 A | * | 5/1998 | Fritz | 257/675 |
| 6,025,651 A | * | 2/2000 | Nam | 257/788 |
| 6,133,629 A | * | 10/2000 | Han et al. | 257/698 |
| 6,147,393 A | * | 11/2000 | Zommer | 257/501 |
| 6,246,115 B1 | * | 6/2001 | Tang et al. | 257/706 |

(Continued)

FOREIGN PATENT DOCUMENTS

EP   0718057   6/1996

(Continued)

*Primary Examiner*—Leonardo Andújar
*Assistant Examiner*—William Harriston
(74) *Attorney, Agent, or Firm*—Thomas R. FitzGerald, Esq.; Hiscock & Barclay, LLP

(57) ABSTRACT

A power device package according to the one embodiment of the present invention includes an insulating substrate with an interconnection pattern disposed on the insulating substrate. The interconnection pattern comprises a single conductive layer comprising a first metal layer, and a multiple conductive layer comprising another first metal layer and a second metal layer disposed on the another first metal layer. A plurality of wires are attached to an upper surface of the single conductive layer and/or an upper surface of the second metal layer of the multiple conductive layer. Contact pads on a power control semiconductor chip and a low power semiconductor chip driving the power control semiconductor chip are electrically connected to the wires.

38 Claims, 4 Drawing Sheets

U.S. PATENT DOCUMENTS

| | | | | |
|---|---|---|---|---|
| 6,281,578 | B1* | 8/2001 | Lo et al. | 257/724 |
| 6,291,880 | B1* | 9/2001 | Ogawa et al. | 257/723 |
| 6,313,520 | B1* | 11/2001 | Yoshida et al. | 257/676 |
| 6,369,454 | B1* | 4/2002 | Chung | 257/787 |
| 6,404,050 | B2 | 6/2002 | Davis et al. | |
| 6,424,035 | B1* | 7/2002 | Sapp et al. | 257/723 |
| 6,445,068 | B1* | 9/2002 | Sofue et al. | 257/723 |
| 6,459,146 | B2* | 10/2002 | Kono | 257/676 |
| 6,521,994 | B1* | 2/2003 | Huse et al. | 257/724 |
| 6,555,900 | B1* | 4/2003 | Morimoto et al. | 257/675 |
| 6,645,606 | B2* | 11/2003 | Nakano et al. | 428/209 |
| 6,759,753 | B2* | 7/2004 | Chao | 257/787 |
| 6,815,746 | B2* | 11/2004 | Suzuki et al. | 257/296 |
| 6,849,940 | B1* | 2/2005 | Chan et al. | 257/706 |
| 6,864,122 | B1* | 3/2005 | Huse et al. | 438/110 |
| 6,864,588 | B2* | 3/2005 | Hung | 257/787 |
| 6,906,404 | B2* | 6/2005 | Maly et al. | 257/678 |
| 6,914,321 | B2* | 7/2005 | Shinohara | 257/678 |
| 6,943,445 | B2* | 9/2005 | Shirakawa et al. | 257/724 |
| 6,998,702 | B1* | 2/2006 | Zwenger et al. | 257/679 |
| 7,053,469 | B2* | 5/2006 | Koh et al. | 257/676 |
| 7,064,425 | B2* | 6/2006 | Takahashi et al. | 257/686 |
| 7,208,826 | B2* | 4/2007 | Sakamoto et al. | 257/687 |
| 7,423,341 | B2* | 9/2008 | Crispell et al. | 257/704 |
| 7,449,726 | B2* | 11/2008 | Nakanishi et al. | 257/177 |
| 7,547,961 | B2* | 6/2009 | Nishizawa et al. | 257/679 |
| 7,675,165 | B2* | 3/2010 | Heberle et al. | 257/723 |
| 7,679,177 | B2* | 3/2010 | Jang | 257/686 |
| 2005/0280163 | A1 | 12/2005 | Schaffer et al. | |
| 2009/0212430 | A1* | 8/2009 | Wyland | 257/741 |

FOREIGN PATENT DOCUMENTS

| | | |
|---|---|---|
| EP | 0878287 | 11/1998 |
| JP | 57009541 | 1/1982 |

\* cited by examiner

POWER DEVICE PACKAGE

CROSS-REFERENCE TO RELATED PATENT APPLICATION

This application claims the benefit of Korean Patent Application No. 10-2006-0137730, filed on Dec. 29, 2006, in the Korean Intellectual Property Office, the disclosure of which is incorporated herein in its entirety by reference.

BACKGROUND OF THE INVENTION

1. Field of the Invention

The present invention relates to a power device package, and more particularly, to a power device package including a printed circuit board.

2. Description of the Related Art

Recent developments in power electronics including such devices as servo drivers, inverters, power regulators, and converters are leading to increasing demands for light, small power devices with excellent performance characteristics. Therefore, research is being actively conducted into smart or intelligent power modules in which a variety of power semiconductor chips and low power semiconductor chips, such as IC chips for controlling the power semiconductor chips, can be integrated into one package.

A power device package includes at least one power control semiconductor chip mounted on a substrate and, if necessary, a low power semiconductor chip controlling the power control semiconductor chip. An interconnection pattern is formed on the substrate for connections to the power control semiconductor chip and/or a low power semiconductor chip. The interconnection pattern may be multi-stacked metal layers. For example, the multi-stacked metal layer may have a copper layer formed on the substrate, and a nickel layer covering the copper layer. Since the copper layer has excellent electrical conductivity and the nickel layer has a good antioxidation property for the underlying copper layer, the multiple stack structure of the nickel layer and the copper layer may be advantageously used for the interconnection pattern.

The power control semiconductor chip is a large chip requiring a high operating current, while the low power semiconductor chip is a relatively small chip compared to the power control semiconductor chip and does not require a high operating current. Considering the different features between the power control semiconductor chip and the low power semiconductor chip, our inventors envisaged that the power control semiconductor chip might be electrically connected to the interconnection pattern by a heavy wire and the low power semiconductor chip might be electrically connected to the interconnection pattern by a small wire.

But we found that even when a surface oxidation layer is formed on the nickel layer or the copper layer, the heavy wire connected to the power control semiconductor chip could ensure reliable electrical contact with the nickel layer or the copper layer by mechanically passing through the surface oxidation layer, however, the small wire connected to the low power semiconductor chip failed to ensure reliable electrical contact with only the nickel layer or the copper layer. In particular, when a gold wire was used as the small wire, it was difficult to achieve reliable bonding of the gold wire with the interconnection pattern because of the surface oxidation layer formed on the nickel layer or the copper layer.

SUMMARY OF THE INVENTION

The present invention provides a power device package in which a high power semiconductor chip and a low power semiconductor chip are electrically connected to a interconnection pattern by wires with different specifications, wherein the interconnection pattern provides a reliable electrical connection with a small wire as well as a heavy wire.

According to an aspect of the present invention, there is provided a power device package comprising an insulating substrate, an interconnection pattern disposed on the insulating substrate, the interconnection pattern comprising a single conductive layer comprising a first metal layer, and a multiple conductive layer comprising the another first metal layer and a second metal layer disposed on the another first metal layer, a plurality of wires attached to an upper surface of the single conductive layer and/or an upper surface of the second metal layer of the multiple conductive layer, and a power control semiconductor chip and a low power semiconductor chip driving the power control semiconductor chip, each comprising contact pads electrically attached to the wires.

In some embodiments of the present invention, the first metal layer comprises copper or copper alloy. The second metal layer comprises aluminum or aluminum alloy, and the wires are attached to the upper surface of the multiple conductive layer.

In other embodiments of the present invention, the first metal layer comprises aluminum or aluminum alloy. The second metal layer comprises copper or copper alloy, and the wires are attached to the upper surface of the single conductive layer.

In some embodiments of the present invention, the wire attached to the power control semiconductor chip has a first diameter, and the wire attached to the low power semiconductor chip has a second diameter less than the first diameter. The first diameter ranges from 5 mil to 20 mil, and the second diameter ranges from 0.8 mil to 3 mil. The wire having the first diameter is stitch-bonded at one end thereof, and the wire having the second diameter is ball-bonded at one end thereof. In some embodiments of the present invention, the wire connected to the power control semiconductor chip comprises aluminum, and the wire connected to the low power semiconductor chip comprises aluminum or gold.

The power device package according to the present invention includes an interconnection pattern including a metal single conductive layer and a multiple conductive layer disposed on an insulating substrate, so that reliable electrical connections for different wires with different specifications, e.g., different thicknesses and materials, can be realized. Also, according to the present invention, since the multiple conductive layer may be formed using an electroless plating method and a wet etching method, the power device package can be manufactured at a low cost.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
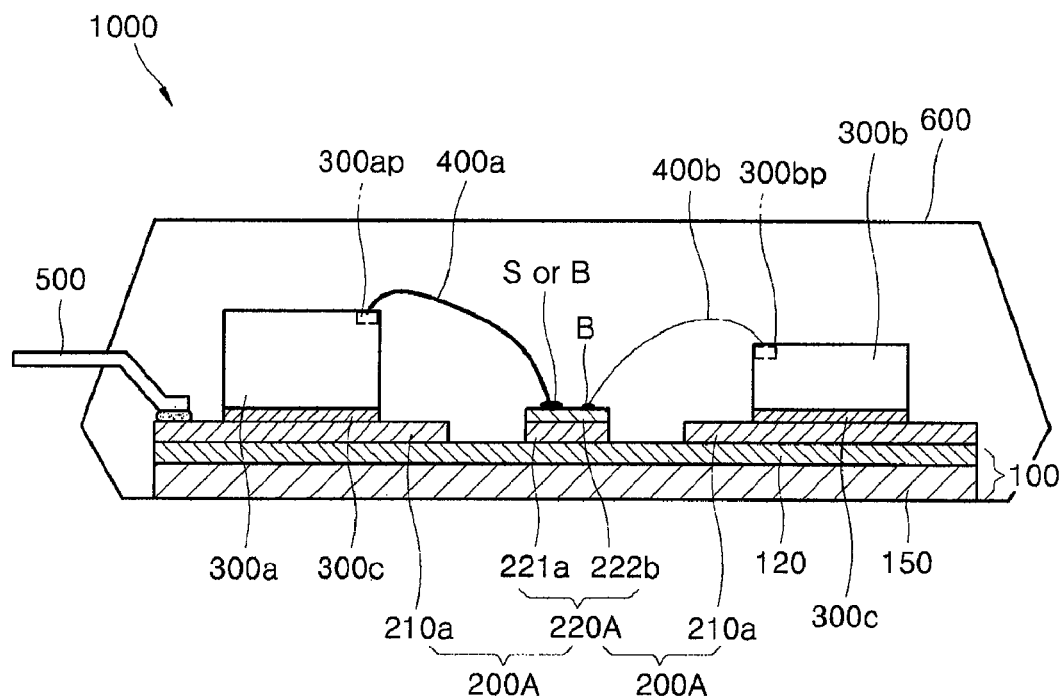
FIG. 1 is a cross-sectional view of a power device package according to an embodiment of the present invention.

The present invention will now be described more fully with reference to the accompanying drawings, in which exemplary embodiments of the invention are shown.

The invention may, however, be embodied in many different forms and should not be construed as being limited to the embodiments set forth herein; rather, these embodiments are provided so that this disclosure will be thorough and complete, and will fully convey the concept of the invention to those skilled in the art. It will also be understood that when a layer is referred to as being "on" another layer or substrate, it can be directly on the other layer or substrate, or intervening layers may also be present. In the drawings, the thicknesses and sizes of layers and regions are exaggerated for clarity, and like reference numerals in the drawings denote like elements. The terms "and/or" used herein includes any and all combinations of one or more of the associated listed items.

Also, though terms like a first, a second, and a third are used to describe various members, elements, regions, layers and/or portions, in various embodiments of the present invention, it is obvious that the members, elements, regions, layers and/or portions are not limited to these terms. These terms are used only to tell one member, element, region, layer and/or portion from another member, element, region, layer and/or portion in an embodiment. Therefore, a member, element, region, layer and/or portion referred to as a first member, element, region, layer and/or portion, can be referred to as a second member, element, region, layer and/or portion in another embodiment without departing from the scope of the present invention. Herein, the terms of first metal and second metal are used to differentiate metal-based materials which are separate elements.

FIG. 1 is a cross-sectional view illustrating a power device package 1000 according to an embodiment of the present invention.

Referring to FIG. 1, an insulating substrate 100 used in the power device package 1000 may include an insulating layer 120 for insulating an interconnection pattern 200A disposed on the insulating substrate 100. Also, the insulating substrate 100 may include a base metal layer 150 on a bottom surface of the insulating substrate 100 opposite to a surface of the insulating substrate 100 on which the interconnection pattern 200A is formed, and the base metal layer 150 may attached to a heat sink (not shown) to thereby provide improved heat dissipation. The insulating layer 120 may be formed from a ceramic layer such as an $Al_2O_3$ layer or a silicon nitride material layer, and the base metal layer 150 may be formed from aluminum, for example.

The interconnection pattern 200A of the power device package 1000 may include a first metal single conductive layer 210a, and a multiple metal conductive layer 220A which includes a first metal conductive layer 221a and a second metal conductive layer 222b on the first metal conductive layer 221a. In some embodiments of the present invention, the interconnection pattern 200A is formed by first depositing a first metal sheet covering the insulating substrate 100 which is then patterned by, for example, a wet-etching process to form the first metal single conductive layer 210a and the first metal conductive layer 221a on the insulating substrate 100. Thereafter, a second metal sheet may be deposited on the insulating substrate 100 including the first metal single conductive layer 210a and the first metal conductive layer 221a by electroless plating.

Then, an etch mask pattern is formed by photolithography on the second metal sheet, and a portion of the second metal layer is selectively removed by wet-etching to form the second metal conductive layer 222b. In some embodiments of the present invention, the first metal layer 222b may have a thickness ranging from 20 µm to 200 µm, and the second metal layers 210a and 221a may have a thickness ranging from 20 µm to 400 µm.

The electroless-plating coating method described above used to form the second metal layer is cost-effective compared to electroplating methods or deposition methods, and thus the interconnection pattern 200A with the double pattern structure can be manufactured economically.

Alternatively, in other embodiments of the present invention, to form the interconnection pattern 200A, a first metal sheet and a second metal sheet are bonded to the insulating substrate 100 by rolling the two metal sheets onto the insulating substrate 100. In some embodiments of the present invention, the first metal sheet may have a thickness ranging from 20 µm to 200 µm, and the second metal sheet may have a thickness ranging from 20 µm to 400 µm.

Then, a patterning process may be performed consecutively on the first metal sheet and the second metal sheet. For example, an etch mask pattern may be formed by photolithography on the second metal sheet, and a portion of the second metal sheet may be selectively removed by wet etching thereby forming the second metal conductive layer 222b on the first metal sheet. Thereafter, an etch mask pattern is formed again, and an exposed portion of the first metal sheet is removed to form the first metal single conductive layer 210a and the multiple metal conductive layer 220A at the same time.

In some embodiments of the present invention the first metal constituting the first metal single conductive layer 210a and the first metal conductive layer 221a may be copper or a copper alloy, and the second metal constituting the second metal conductive layer 222b may be aluminum or an aluminum alloy. As the first metal single conductive layer 210a and the first metal conductive layer 221a are formed from a different material than the second metal conductive layer 222b, sufficient etch selectivity can be achieved to form the double pattern interconnection structure. As shown in FIG. 1, the first metal conductive layer 221a may be coated entirely with the second metal conductive layer 222b. But the first metal conductive layer 221a may be partially coated to selectively expose a portion of a surface of the first metal conductive layer 221a.

A power control semiconductor chip 300a controlling power of an external high-power system such as a motor, and/or a low power semiconductor chip 300b driving the power control semiconductor chip 300a, may be disposed on the interconnection pattern 200A. Bottom surfaces of the power control semiconductor chip 300a and/or the low power semiconductor chip 300b may be bonded to the first metal single conductive layer 210a to provide a drain electrode or a ground electrode. As is well-known in the art, when the first metal is copper or copper alloy, the bottom surfaces of the power control semiconductor chip 300a and/or the low power semiconductor chip 300b may be bonded to the first metal single conductive layer 210a with solder or conductive epoxy 300c.

Contact pads 300ap and 300bp formed at top surfaces of the power control semiconductor chip 300a and the low power semiconductor chip 300b, respectively, may be electrically connected to the second metal conductive layer 222b of the multiple metal conductive layer 220A by wires 400a and 400b, respectively. If the second metal conductive layer 222b is an aluminum thin film, an aluminum wire or a gold wire, which have excellent bonding characteristics with respect to the aluminum thin film, may be used as the wire 400b. Because of the excellent bonding characteristics, a small wire can be used for a connection with the low power conduction chip 300b in an embodiment of the present invention.

For example, with regard to the power control semiconductor chip 300a, the contact pad 300ap and the aluminum metal conductive layer 222b may be connected together by a heavy aluminum wire. With regard to the low power semiconductor chip 300b, the contact pad 300bp and the aluminum metal conductive layer 222b may be connected together by a small aluminum wire or a small gold wire. The heavy wire may have, for example, a diameter of 5 mil to 20 mil, and the small wire may have, for example, a diameter of 0.8 mil to 3 mil.

As is well known in the art, the heavy wire 400a may be connected by stitch bonding (S) or ball bonding (B), and the small wire 400b may be connected by ball bonding (B). As will be described later, when the heavy wire 400a is connected by the stitch bonding (S), the heavy wire 400a may be connected if necessary directly to the first metal single conductive layer 210a which may be a copper single conductive layer, for example. According to an embodiment of the present invention, as the interconnection pattern 200A includes both the single conductive layer 210a and the multiple conductive layer 220A formed of different layered materials, the respective wires 400a and 400b provide reliable electrical connections as described above.

The power control semiconductor chip 300a and the low power semiconductor chip 300b may be connected to a circuit outside the power device package 1000 through a plurality of leads 500. Internal elements of the power device package 1000 may be protected by a encapsulating material such as an epoxy molding compound 600.

Figure 2:
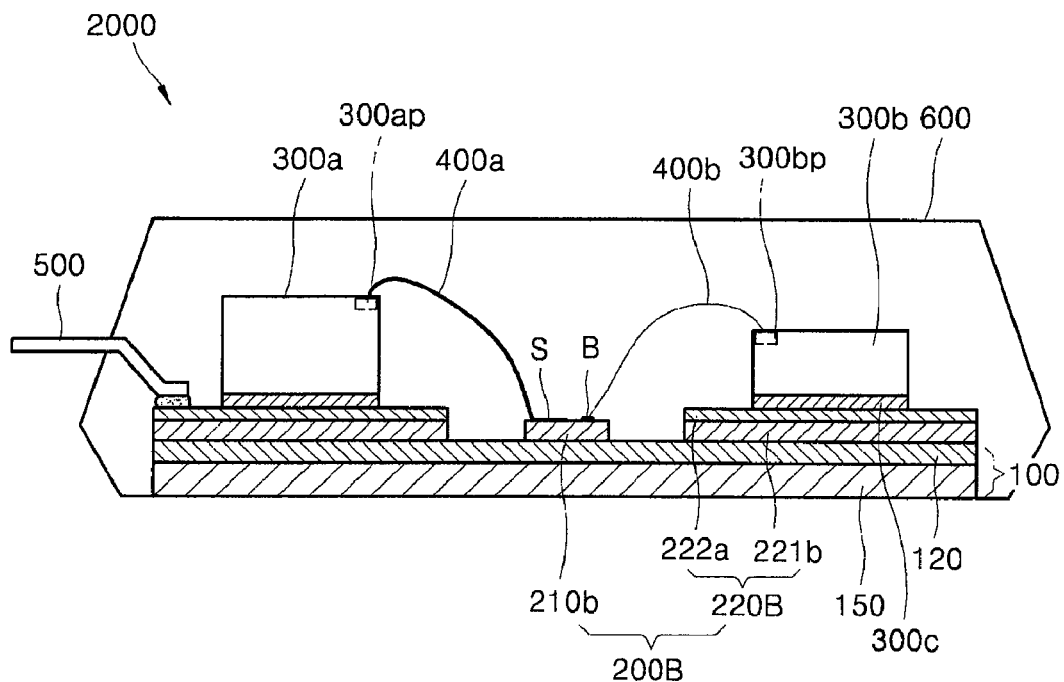
FIG. 2 is a cross-sectional view of a power device package according to another embodiment of the present invention.

FIG. 2 is a cross-sectional view of a power device package 2000 according to another embodiment of the present invention.

Referring to FIG. 2, an interconnection pattern 200B includes a second metal single conductive layer 210b, and a multiple metal conductive layer 220B including a second metal conductive layer 221b, and a first metal conductive layer 222a disposed on the second metal conductive layer 221b. As described with reference to FIG. 1, to form the interconnection pattern 200B, a second sheet layer is formed on an insulating substrate 100, and then is patterned by, for example, wet etching to thus form the second metal single conductive layer 210b and the second metal conductive layer 221b of the multiple metal conductive layer 220B. Thereafter, the first metal layer 222a is formed by first electroless plating a first metal sheet on the insulating substrate 100 and the second metal single conductive layer 210b and the second metal conductive layer 221b. Next, an etch mask pattern for a photolithography process is formed on the first metal sheet, and a portion of the first metal sheet is selectively removed by wet etching to thus form the first metal conductive layer 222a on the second metal conductive layer 221b. In some embodiments of the present invention, the first metal layer 222a may have a thickness ranging from 20 μm to 200 μm, and the second metal layers 210b and 221b may have a thickness ranging from 20 μm to 400 μm.

Alternatively, a first metal sheet and second metal sheet are bonded to the insulating substrate 100 by rolling the two metal sheets onto the insulating substrate 100. In some embodiments of the present invention, the first metal sheet may have a thickness ranging from 20 μm to 200 μm, and the second metal sheet may have a thickness ranging from 20 μm to 400 μm. Next, a patterning process may be consecutively performed on the first metal layer and the second metal layer to form the interconnection pattern 200B according to an embodiment of the present invention.

With regard to the interconnection pattern 200B, a second metal of the second metal single conductive layer 210b and the second metal conductive layer 221b of the multiple metal conductive layer 220B may be an aluminum thin film, and the first metal conductive layer 222a of the multiple conductive layer 220B may be a copper thin film. The bottom surfaces of the power control semiconductor chip 300a and/or the low power semiconductor chip 300b may be bonded to the first metal conductive layer 222a to provide a drain electrode or a ground electrode. As is well known in the art, when the first metal conductive layer 222a is a copper thin film, the bottom surfaces of the power control semiconductor chip 300a and/or the low power semiconductor chip 300b may be bonded with solder or conductive epoxy 300c.

Contact pads 300ap and 300bp formed at top surfaces of the power control semiconductor chip 300a and the low power semiconductor chip 300b, respectively, may be electrically connected to the second metal single conductive layer 210b by wires such as a heavy wire 400a and a small wire 400b, respectively. If the second metal conductive layer 210b is an aluminum thin film, an aluminum wire or a gold wire, which have excellent bonding characteristics with respect to the aluminum thin film, may be used as the wire 400b. Because of the excellent bonding characteristics, a small wire can be used for a connection with the low power conduction chip 300b in an embodiment of the present invention.

For example, with regard to the power control semiconductor chip 300a, the contact pad 300ap and the aluminum metal single conductive layer 210b may be connected together by a heavy aluminum wire. With regard to the low power semiconductor chip 300b, the contact pad 300bp and the aluminum metal single conductive layer 210b may be connected together by a small aluminum wire or a small gold wire.

As described above with reference to FIG. 1, the heavy wire 400a may have, for example, a diameter of 5 mil to 20 mil, and the small wire 400b may have, for example, a diameter of 0.8 mil to 3 mil. The heavy and small wires 400a and 400b may be connected to the second metal single conductive layer 210b by stitch bonding (S) or ball bonding (B).

Figure 3:
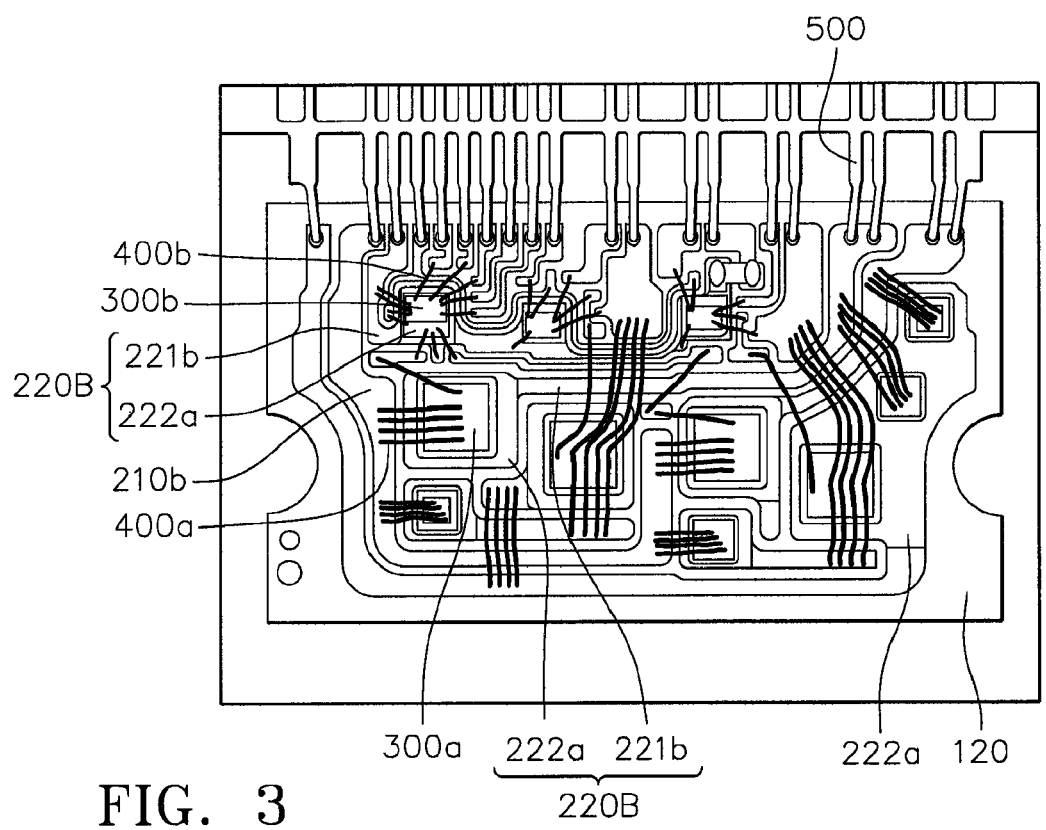
FIG. 3 is a photographic image showing an actual power device package including an interconnection pattern of the type shown in FIG. 2.

FIG. 3 is a photographic image of a power device package including the interconnection pattern 200B of FIG. 2. Referring to FIG. 3, the interconnection pattern 200B includes the single conductive layer 210b which appear as light traces of aluminum which do not contain dark regions with devices die bonded to them. The dark regions with devices die bonded to them are copper conductive layer 222a stacked on aluminum conductive layer 221b. Bottom surfaces of the power control semiconductor chip 300a and the low power semiconductor chip 300b are bonded to the copper conductive layer 222a by soldering. As illustrated in FIG. 3, only a portion of the aluminum conductive layer 221b may be coated with the copper conductive layer 222a; that is, the first metal conductive layer 222a leaves exposed a portion of a surface of the aluminum conductive layer 221b.

The contact pads 300ap and 300bp respectively formed on the semiconductor chips 300a and 300b are connected with the aluminum single conductive layer 210b by the plurality of wires such as the heavy and small wires 400a and 400b. In this embodiment, the heavy wire 400a of aluminum is used for a connection with the power control semiconductor chip 300a, and the small wire 400b of gold is used for a connection with the low power semiconductor chip 300b. According to the embodiments of the present invention, reliable electrical connections of the heavy and small wires or aluminum and gold wires 400a and 400b can be achieved because of the interconnection pattern 220B including both the single conductive layer 210b and the multiple conductive layer 220B formed of different metals. In particular, since a copper conductive layer may be used as the first metal conductive layer 222a, the power control semiconductor chip 300a can be a directly bonded copper (DBC) power device having a low leakage current characteristic and excellent mechanical bonding strength.

The power device package 1000 according to the embodiment illustrated in FIG. 1 and the power device package 2000 according to the embodiment illustrated in FIG. 2 are different in that the stacking order of the aluminum and copper metal layers of the interconnection pattern 200A of the power device package 1000 is reverse to that of the aluminum and copper metal layers of the interconnection pattern 200B of the power device package 2000. If the area on the insulating substrate 100 where the bottom surfaces of the power control semiconductor chip 300a and the low power semiconductor chip 300b are bonded requires more area than where the heavy and small wires 400a and 400b are bonded, the interconnection pattern 220B illustrated in FIG. 2 may be preferable. In contrast, if the area on the insulating substrate 100 where the wires 400a and 400b are bonded requires more than where the bottom surfaces of the power control semiconductor chip 300a and the low power semiconductor chip 300b are bonded, the interconnection pattern 220A illustrated in FIG. 1 may be preferable.

Figure 4:
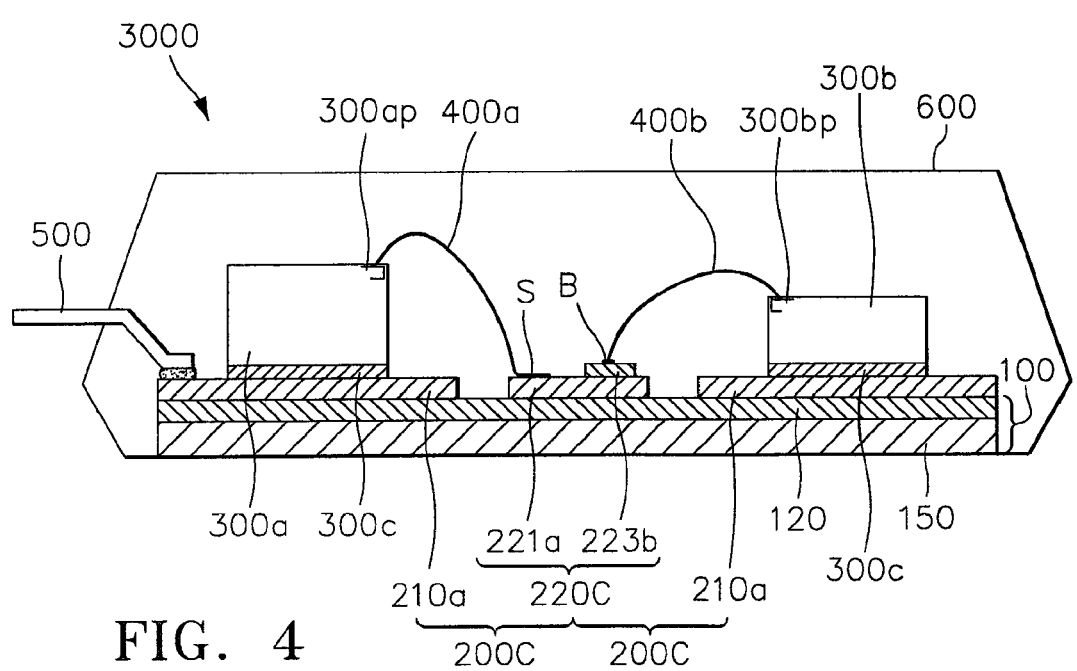
FIG. 4 is a cross-sectional view of a power device package according to another embodiment of the present invention.

FIG. 4 is a cross-sectional view illustrating a power device package 3000 according to another embodiment of the present invention. Referring to FIG. 4, an insulating substrate 100 used for the power device package 3000 may include an insulating layer 120 for insulating an interconnection pattern 200C disposed on the insulating substrate 100. Also, the insulating substrate 100 may include a base metal layer 150 on a bottom surface of the insulating layer opposite to a surface on which the interconnection pattern 200C is formed, and the base metal layer 150 may be in contact with a heat sink (not shown) for heat dissipation.

The interconnection pattern 200C includes a first metal single conductive layer 210a, and a multiple conductive layer 220C including a first metal conductive layer 221a and a wedge bonded second conductive layer 223b disposed on the first metal conductive layer 221a. Unlike the interconnection patterns 200A and 200B illustrated in FIGS. 2 and 3 where the second metal conductive layer 222b or the first metal conductive layer 222a may be stacked in a layer type structure, the interconnection pattern 200C illustrated in FIG. 4 includes the wedge bonded second conductive layer 223b disposed locally on the first metal conductive layer 221a and providing a conductive bonding area.

Figure 5:
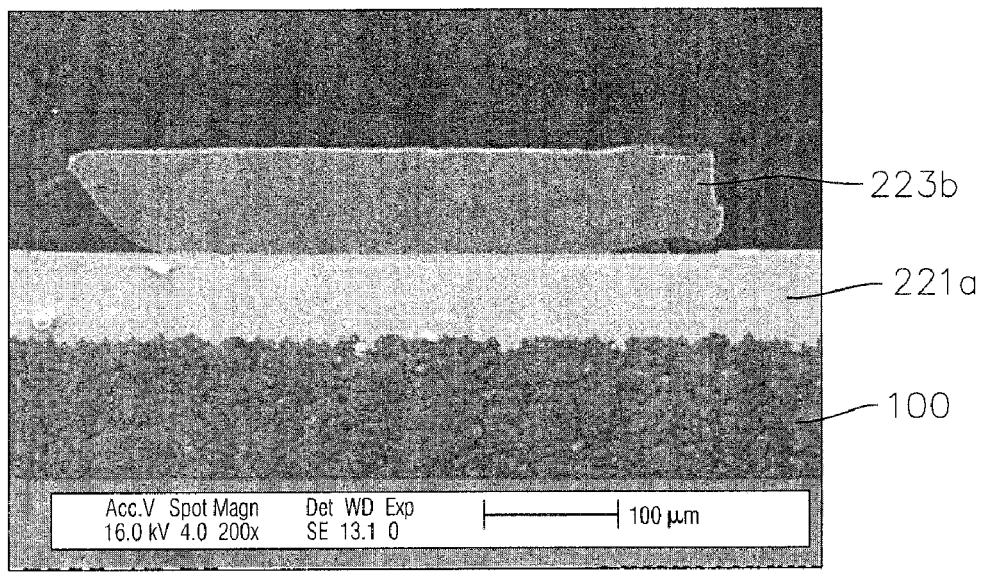
FIG. 5 is a scanning electron microscope (SEM) image showing a section of the wedge bonded second conductive layer shown in FIG. 4.

FIG. 5 is a scanning electron microscope (SEM) image illustrating a sectional shape of the wedge bonded second conductive layer 223b of FIG. 4, according to an embodiment of the present invention. Referring to FIG. 5, a copper thin film is used as the first metal single conductive layer 210a and the first metal conductive layer 221a, and the wedge bonded second conductive layer 223b on the first metal conductive layer 221a is formed of aluminum. The thicknesses of the first metal single conductive layer 210a and the first metal conductive layer 221a may range from 20 µm to 200 µm, respectively, and the thickness of the wedge bonded second conductive layer 223b may range from 20 µm to 200 µm.

Figure 6:
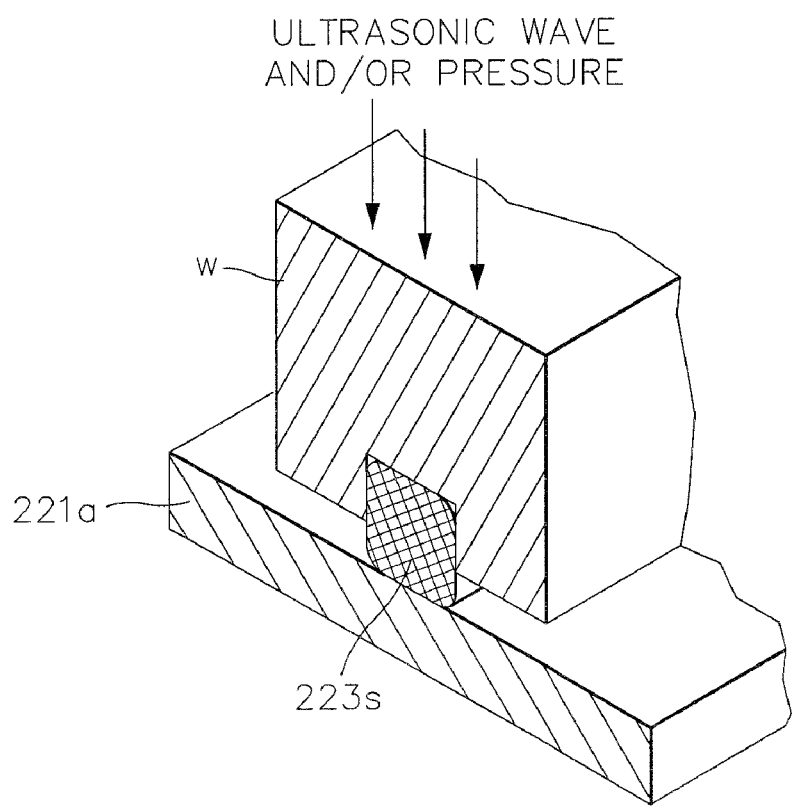
FIG. 6 is a schematic perspective sectional view of a wedge bonder tool for manufacturing the wedge bonded second conductive layer shown in FIG. 4.

FIG. 6 is a schematic perspective sectional view of a wedge bonder tool (W) used to form the wedge bonded second conductive layer 223b illustrated in FIG. 4. The wedge bonder tool (W) is aligned at a region in which a wire 400b is to be bonded to the first metal conductive layer 221a. Then, a second metal wire source 223s from the wedge bonder tool (W) is shape-formed on the first metal conductive layer 221a by pressing mechanically using ultrasonic wave bonding. Thereafter, a pressed portion of the second metal wire source 223s may be trimmed to form the wedge bonded second conductive layer 223b on the first metal conductive layer 221a. The upper surface of the wedge bonded second conductive layer 223b may be planarized using the wedge bonder tool (W) with a planar contact surface.

Referring again to FIG. 4, the bottom surfaces of the power control semiconductor chip 300a and/or the low power semiconductor chip 300b may be bonded to the first metal single conductive layer 210a. The contact pad 300bp of the low power semiconductor chip 300b may be connected to the wedge bonded second conductive layer 223b by the small wire 400b. The contact pad 300ap of the power control semiconductor chip 300a may be connected to the first metal conductive layer 221a by a heavy wire 400a.

When a copper thin film is used as the first metal conductive layer 221a, the heavy wire 400a may be connected to the first metal conductive layer 221a by stitch bonding (S). When the wedge bonded second conductive layer 223b is formed of aluminum, an aluminum wire or a gold wire may be used as the small wire 400b. The heavy wire 400a may have a diameter of 5 mil to 20 mil and the small wire 400b may have a diameter of 0.8 mil to 3 mil.

Figure 7:
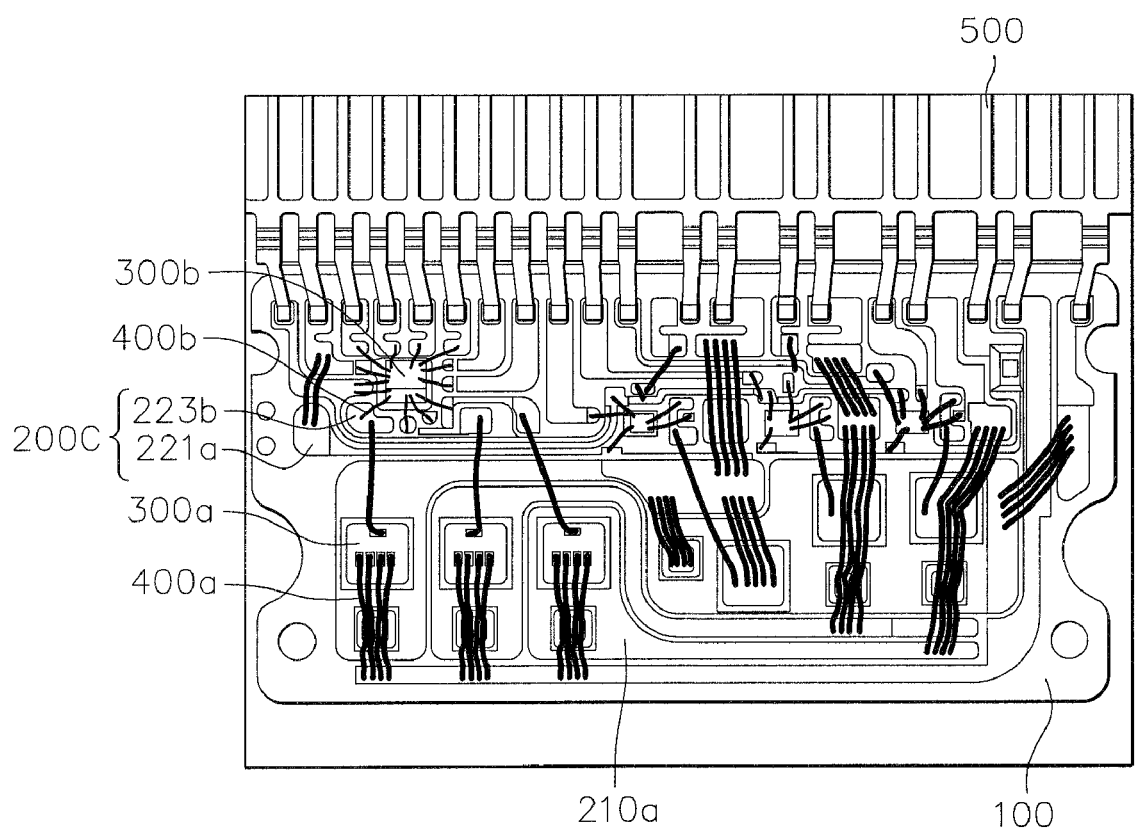
FIG. 7 is a photographic image showing an actual power module including a interconnection pattern of the type shown in FIG. 4.

FIG. 7 is a photographic image of an actual power device package including the interconnection pattern 200C of FIG. 4. The copper single conductive layer 210a and the copper conductive layer 221a appear as relatively dark gray areas in FIG. 7. The aluminum wedge bonded second conductive layer 223b is formed locally on the copper conductive layer 221a. The aluminum wedge bonded second conductive layer 223b and the low power semiconductor chip 300b are connected by the small wire 400b of gold. The power control semiconductor chip 300a is connected to the copper conductive layer 221a by the heavy wire 400a formed of aluminum and bonded by stitch bonding.

The second conductive layer 223b, although limited to providing a local bonding area, is not necessarily formed by a wedge bonding tool. Also, an interface or an adhesive layer for bonding two different metals in the interconnection patterns according to the various embodiments of the present invention may be present between the first metal conductive layer and the second metal conductive layer, and a new coating layer may be provided on the second metal conductive layer or the first metal single conductive layer to reinforce wire bonding or protect the surface of the conductive layers.

The power device package according to the embodiments described above includes an interconnection pattern with a metal single conductive layer and a multiple conductive layer disposed on an insulating substrate, so that reliable electrical connections for different wires with different specifications, e.g., different thicknesses and materials, can be realized.

Also, since the multiple conductive layer may be formed using electroless plating and a wet etching method, the power device package can be manufactured at a low cost.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A power device package comprising:
    an insulating substrate;
    an interconnection pattern disposed on the insulating substrate, the interconnection pattern comprising a single conductive layer comprising a first metal layer and a multiple conductive layer comprising another first metal layer and a second metal layer disposed on the another first metal layer;
    a plurality of wires comprising a first wire having a first diameter and second wire having a second diameter less than the first diameter; and
    a contact pad on a power control semiconductor chip and a contact pad on a low power semiconductor chip driving the power control semiconductor chip, each contact pad electrically connected to one end of one the first and second wires,
    wherein a bottom surface of at least one of the power control semiconductor chip and the low power semiconductor chip is bonded to one of the single conductive layer and the second metal layer of the multiple conductive layer, while the other ends of the first and second wires are bonded to the other of the single conductive layer and the second metal layer of the multiple conductive layer.

2. The power device package of claim 1, wherein the first metal layer comprises copper or copper alloy.

3. The power device package of claim 1, wherein the first metal layer comprises aluminum or aluminum alloy.

4. The power device package of claim 2, wherein the second metal layer comprises aluminum or aluminum alloy.

5. The power device package of claim 3, wherein the second metal layer comprises copper or copper alloy.

6. The power device package of one of claim 1, wherein the one end of the first wire is bonded to the contact pad on the power control semiconductor chip and one end of the second wire is bonded to the contact pad on the lower semiconductor chip.

7. The power device package of claim 6, wherein the first diameter ranges from 5 mil to 20 mil, and the second diameter ranges from 0.8 mil to 3 mil.

8. The power device package of claim 1, wherein the at first wire having the first diameter is stitch-bonded at the respective other thereof, and the second wire having the second diameter is ball-bonded at the respective other thereof.

9. The power device package of claim 1, wherein the first wire connected to the power control semiconductor chip comprises aluminum, and the second wire connected to the low power semiconductor chip comprises aluminum or gold.

10. The power device package of claim 1, wherein the insulating substrate comprises a base metal layer disposed on a bottom surface of the insulating substrate opposite to a surface of the insulating substrate on which the interconnection pattern is disposed.

11. The power device package of claim 1, wherein the first metal layer has a thickness ranging from 20 µm to 200 µm; and
the second metal layer has a thickness ranging from 20 µm to 400 µm.

12. A power device package comprising:
    an insulating substrate;
    an interconnection pattern disposed on the insulating substrate, the interconnection pattern comprising a first metal layer and a second metal layer partially on the first metal conductive layer;
    a plurality of wires comprising a first wire having a first diameter and second wire having a second diameter less than the first diameter; and
    a contact pad on a power control semiconductor chip and a contact pad on a low power semiconductor chip driving the power control semiconductor chip, each electrically connected to the wires,
    wherein the first wire is bonded at one end thereof to the first metal layer and bonded at the other end thereto to the contact pad on the power control semiconductor chip, while the second wire is bonded at one end thereof to the second metal layer and bonded at the other end thereof to the contact pad on the lower power semiconductor chip.

13. The power device package of claim 12, wherein the first metal layer comprises copper or a copper alloy.

14. The power device package of claim 12, wherein the second metal layer comprises aluminum or aluminum alloy.

15. The power device package of claim 12, wherein an upper surface of the second metal layer is planar.

16. The power device package of claim 12, wherein the first diameter ranges from 5 mil to 20 mil, and the second diameter ranges from 0.8 mil to 3 mil.

17. The power device package of claim 12, wherein the first wire having the first diameter is stitch bonded to the first metal layer, and the second wire having the second diameter is ball bonded to the second metal layer.

18. The power device package of claim 12, wherein the first wire attached to the power control semiconductor chip comprises aluminum or aluminum alloy, and
the second wire connected to the low power semiconductor chip comprises aluminum, aluminum alloy, gold or gold alloy.

19. The power device package of claim 12, wherein the power control semiconductor chip and/or the low power semiconductor chip are bonded to the first metal layer with solder or conductive epoxy.

20. The power device package of claim 12, wherein the insulating substrate comprises a base metal layer disposed on a bottom surface of the insulating substrate opposite to a surface of the insulating substrate on which the interconnection pattern is disposed.

21. The power device package of claim 12, wherein the first metal layer has a thickness ranging from 20 µm to 200 µm, and
the second metal layer has a thickness ranging from 20 µm to 400 µm.

22. A power device package comprising:
    an insulating substrate;
    an interconnection pattern disposed on the insulating substrate, the interconnection pattern comprising a first metal layer and a second metal layer disposed partially on the first metal layer to expose a portion of a surface of the first metal layer;
    a plurality of wires attached at a first end thereof to a surface of the interconnection pattern; and
    a power control semiconductor chip comprising contact pads which are attached to a second end of at least one of the wires.

23. The power device package of claim 22, wherein the wires are bonded to an exposed surface of the first metal layer and/or an exposed surface of the second metal layer.

24. The power device package of claim 22, wherein the first metal comprises copper or copper alloy.

25. The power device package of claim 22, wherein the first metal layer comprises aluminum or aluminum alloy.

26. The power device package of claim 24, wherein the second metal layer comprises aluminum or aluminum alloy, and at least one of the wires is bonded to the surface of the second metal layer.

27. The power device package of claim 25, wherein the second metal layer comprises copper or copper alloy, and at least one of the wires is bonded to the exposed surface of the second metal layer.

28. The power device package of claim 26, wherein the second metal layer comprises copper or copper alloy, and at least one of the wires is bonded to the exposed surface of the second metal layer.

29. The power device package of claim 22, further comprising a low power semiconductor chip driving the power control semiconductor chip, the low power semiconductor chip comprising contact pads attached to at least one of the wires.

30. The power device package of claim 22, wherein a bottom of the power control semiconductor chip and/or the low power semiconductor chip are bonded to the exposed surface of the first metal layer or the second metal layer with solder or conductive epoxy.

31. The power device package of claim 22, wherein the insulating substrate comprises a ceramic layer or a silicon nitride layer.

32. The power device package of claim 22, wherein the power control semiconductor chip and/or the low power semiconductor chip are electrically connected to an outer circuit through a plurality of leads.

33. The power device package of claim 22, wherein the wire attached to the power control semiconductor chip has a first diameter, and the wire attached to the low power semiconductor chip has a second diameter less than the first diameter.

34. The power device package of claim 33, wherein the first diameter ranges from 5 mil to 20 mil, and the second diameter ranges from 0.8 mil to 3 mil.

35. The power device package of claim 33, wherein the wire having the first diameter is stitch-bonded to the first metal layer, and the wire having the second diameter is ball-bonded to the second metal layer.

36. The power device package of claim 33, wherein the wire attached to the power control semiconductor chip comprises aluminum or aluminum alloy, and the wire attached to the low power semiconductor chip comprises aluminum, aluminum alloy, gold or gold alloy.

37. The power device package of claim 22, wherein the insulating substrate comprises a base metal layer disposed on a bottom surface of the insulating substrate opposite to a surface of the insulating substrate on which the interconnection pattern is disposed.

38. The power device package of claim 22, wherein the first metal layer has a thickness ranging form 20 μm to 200 μm, and the second metal layer has a thickness ranging from 20 μm to 400 μm.

* * * * *